United States Patent
Sim et al.

(10) Patent No.: US 9,190,624 B2
(45) Date of Patent: Nov. 17, 2015

(54) ORGANIC LIGHT EMITTING DIODE DISPLAY

(71) Applicant: Samsung Display Co., Ltd., Yongin, Gyeonggi-Do (KR)

(72) Inventors: Joong-Won Sim, Yongin (KR); Ji-Hwan Yoon, Yongin (KR); Chang-Ho Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/190,046

(22) Filed: Feb. 25, 2014

(65) Prior Publication Data

US 2014/0264295 A1  Sep. 18, 2014

(30) Foreign Application Priority Data

Mar. 12, 2013  (KR) .................. 10-2013-0026248

(51) Int. Cl.
  *H01L 27/32* (2006.01)
  *H01L 51/50* (2006.01)

(52) U.S. Cl.
  CPC ........ *H01L 51/5056* (2013.01); *H01L 27/3211* (2013.01)

(58) Field of Classification Search
  CPC .......................... H01L 27/3216; H01L 27/32
  USPC ......................... 257/40, 98; 438/35
  See application file for complete search history.

(56) References Cited

U.S. PATENT DOCUMENTS

| | | | |
|---|---|---|---|
| 7,351,999 B2 * | 4/2008 | Li | 257/40 |
| 7,535,167 B2 * | 5/2009 | Yoon | 313/504 |
| 2005/0274961 A1 * | 12/2005 | Iou | 257/82 |
| 2008/0299365 A1 * | 12/2008 | Choi et al. | 428/213 |
| 2011/0240984 A1 | 10/2011 | Adamovich et al. | |
| 2012/0018749 A1 * | 1/2012 | Lee et al. | 257/89 |
| 2013/0306953 A1 * | 11/2013 | Kakimoto et al. | 257/40 |

FOREIGN PATENT DOCUMENTS

| | | |
|---|---|---|
| JP | 2006-237038 A | 9/2006 |
| KR | 10-0777740 B1 | 11/2007 |
| KR | 10-2011-0110172 A | 10/2011 |

* cited by examiner

*Primary Examiner* — Sheng Zhu
(74) *Attorney, Agent, or Firm* — Christie, Parker & Hale, LLP (57) ABSTRACT

An OLED display having a first pixel, a second pixel, and a third pixel which neighbor each other, includes: a plurality of first electrodes provided respectively corresponding to the first pixel, the second pixel, and the third pixel and being separated from each other; a hole injection layer provided on the plurality of first electrodes; a main emission layer including a first emission layer disposed on the hole injection layer corresponding to the first pixel, a second emission layer disposed on the hole injection layer corresponding to the second pixel, and a third emission layer disposed on the hole injection layer corresponding to the third pixel; a p-type hole transport layer disposed between the second emission layer and the hole injection layer and p-type doped; and a second electrode disposed on the main emission layer.

9 Claims, 6 Drawing Sheets

ORGANIC LIGHT EMITTING DIODE DISPLAY

CROSS-REFERENCE TO RELATED APPLICATION

This application claims priority to and the benefit of Korean Patent Application No. 10-2013-0026248, filed in the Korean Intellectual Property Office on Mar. 12, 2013, the entire content of which is incorporated herein by reference.

BACKGROUND

1. Field

One or more aspects of the present invention relate generally to an organic light emitting diode (OLED) display. More particularly, one or more aspects of the present invention relate to an OLED display including an organic emission layer.

2. Description of the Related Art

A display device is an apparatus to display an image and, recently, the organic light emitting diode (OLED) display device is getting more attention.

Since the organic light emitting diode (OLED) display has a self light-emitting characteristic such that a separate light source is not required, unlike a liquid crystal display (LCD), thickness and weight thereof may be reduced. In addition, the OLED display device represents high-quality characteristics, such as lower power consumption, higher luminance, higher reaction speed, or the like.

In general, the OLED display includes an organic light emitting element where a first electrode, a hole injection layer, a hole transport layer, a main emission layer, an electron transport layer, an electron injection layer, and a second electrode are sequentially layered. The organic light emitting element is provided in each pixel, which is the minimum unit for displaying an image.

However, in a comparable OLED display, when the organic light emitting element is not driven and thus displays a black image, an undesired micro current flows to the main emission layer from the first electrode, thereby causing the main emission layer to emit light undesirably.

The above information disclosed in this Background section is only for enhancement of understanding of the background of the described technology and therefore it may contain information that does not form the prior art that is already known in this country to a person of ordinary skill in the art.

SUMMARY

Aspects of embodiments of the present invention are directed toward an OLED display of which a main emission layer can be suppressed from emitting light due to an undesired micro current.

According to an embodiment of the present invention, an OLED display includes a first pixel, a second pixel, and a third pixel which neighbor each other. The OLED display includes: a plurality of first electrodes provided respectively corresponding to the first pixel, the second pixel, and the third pixel and being separated from each other; a hole injection layer provided on the plurality of first electrodes; a main emission layer including a first emission layer disposed on the hole injection layer corresponding to the first pixel, a second emission layer disposed on the hole injection layer corresponding to the second pixel, and a third emission layer disposed on the hole injection layer corresponding to the third pixel; a p-type hole transport layer disposed between the second emission layer and the hole injection layer and p-type doped; and a second electrode disposed on the main emission layer.

The hole injection layer may be provided to extend over each of the plurality of first electrodes corresponding to the first pixel, the second pixel, and the third pixel.

The first emission layer may include a red fluorescent material, the second emission layer may include a green phosphorescent material, and the third emission layer may include a blue fluorescent material.

The second emission layer may have greater electric resistance than each of the first emission layer and the third emission layer.

The p-type hole transport layer HTL may be provided only between the second emission layer and the hole injection layer.

The p-type hole transport layer may be provided to extend only from between the second emission layer and the hole injection layer to between the third emission layer and the hole injection layer.

The p-type hole transport layer may be provided to extend only from between the second emission layer and the hole injection layer to between the first emission layer and the hole injection layer.

The hole injection layer HIL may include a p-type hole injection layer contacting the first electrode and p-type doped.

The OLED display may further include an electron transport layer provided between the main emission layer and the second electrode.

The OLED display may further include: a first auxiliary layer provided between the first emission layer and the hole injection layer and having a first thickness; a second auxiliary layer provided between the second emission layer and the hole injection layer and having a second thickness that is thinner than the first thickness; and a third auxiliary layer provided between the third emission layer and the hole injection layer and having a third thickness that is thinner than the second thickness.

DETAILED DESCRIPTION

The present invention will be described more fully hereinafter with reference to the accompanying drawings, in which example embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, in several example embodiments, a constituent element having the same configuration will be representatively described in a first example embodiment by using the same reference numeral, and other configurations different from those of the first example embodiment will be described in other example embodiments.

As the size and thickness of the respective structural components shown in the drawings are arbitrarily illustrated for explanatory convenience, the present invention is not necessarily limited to the illustrated.

In the drawings, the thickness of layers, films, panels, regions, etc., are exaggerated for clarity. In the drawings, for understanding and ease of description, the thickness of some layers and areas is exaggerated. In addition, in the specification, it will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements. Furthermore, a term 'over' or 'on' refers to a specific part is placed over or under a target part, but does not necessarily mean that the specific part is placed over the target part on the basis of the gravity direction.

Hereinafter, an organic light emitting diode (OLED) display according to a first example embodiment will be described with reference to FIG. 1 to FIG. 4.

Figure 1:
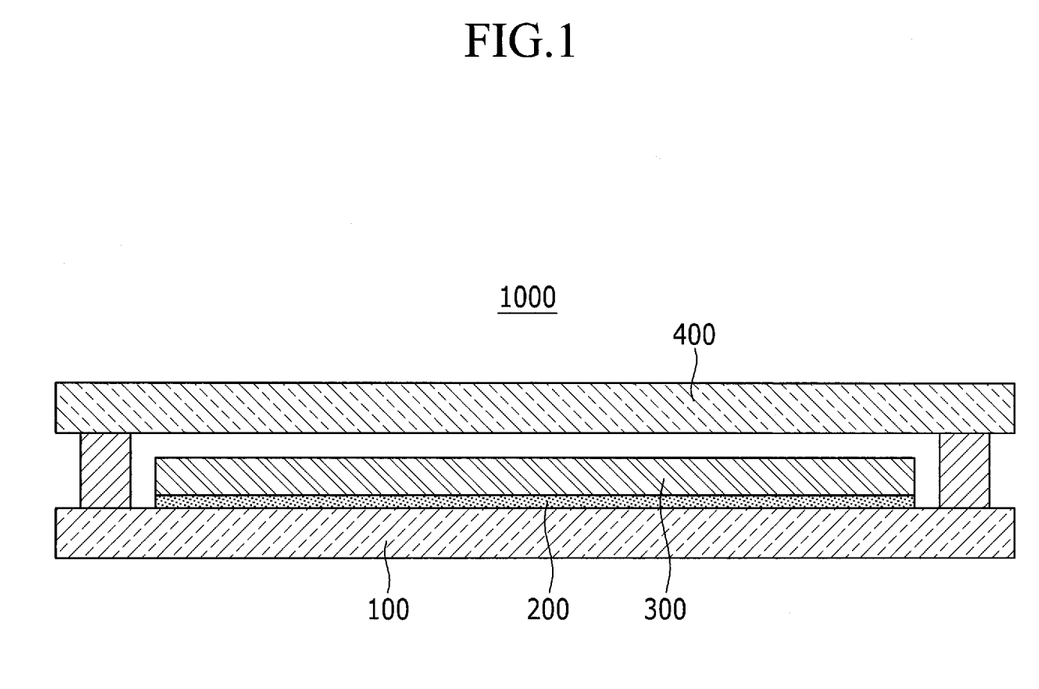
FIG. 1 is a cross-sectional view of an OLED display according to a first example embodiment.

FIG. 1 is a cross-sectional view of an OLED display according to a first example embodiment.

As shown in FIG. 1, an OLED display 1000 according to the first example embodiment includes a first substrate 100, a wire portion 200, an organic light emitting element 300, and a second substrate 400.

The first substrate 100 and the second substrate 400 are light transmissive and electrically insulated substrates including glass or polymer. The first substrate 100 and the second substrate 400 are disposed facing each other, and they are sealed to each other by a sealant 500. The wire portion 200 and the organic light emitting element 300 are disposed between the first substrate 100 and the second substrate 400, and the first substrate 100 and the second substrate 400 protect the wire portion 200 and the organic light emitting element 300 from external interference.

Figure 2:
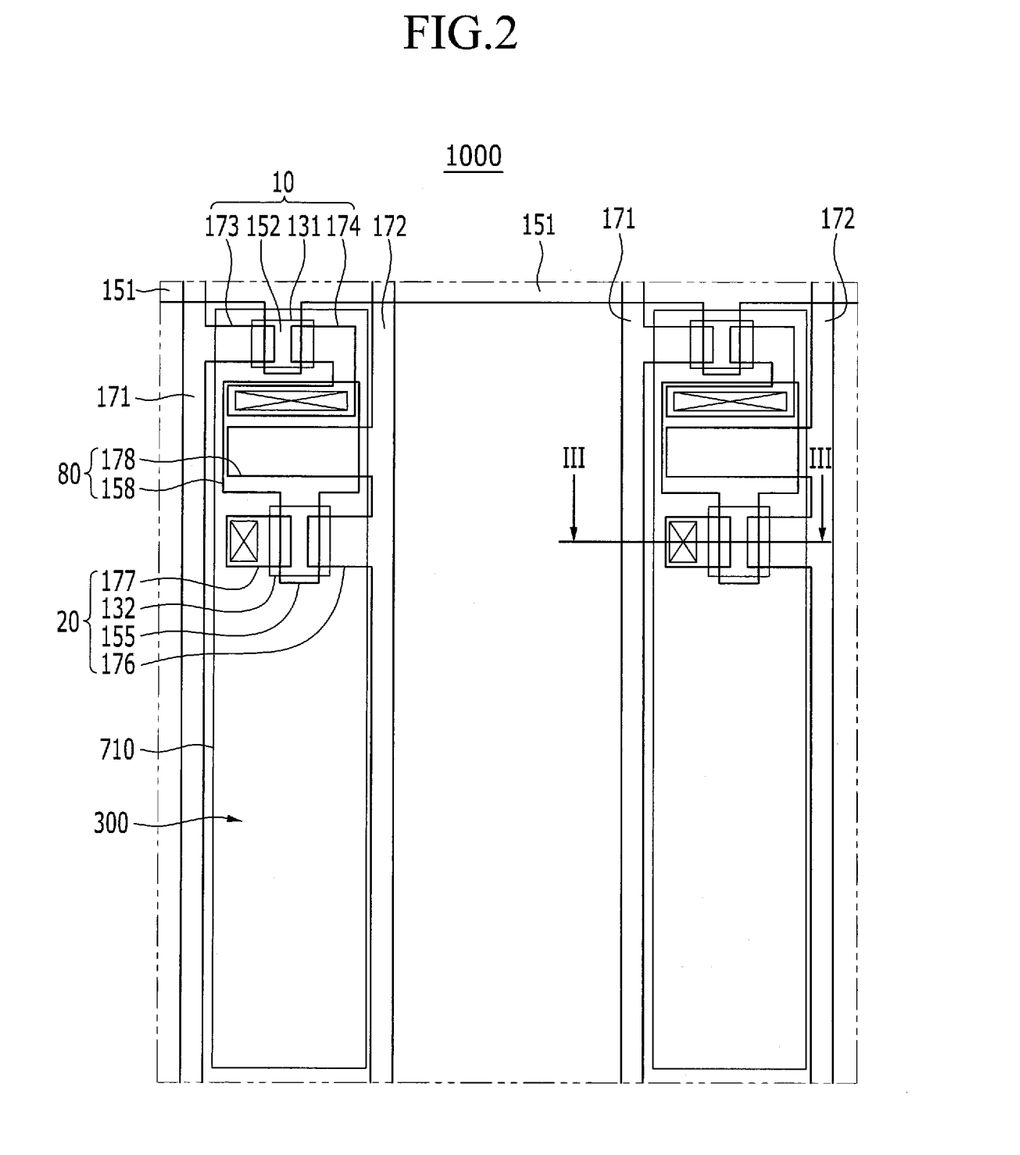
FIG. 2 illustrates a layout of a pixel structure of the OLED display according to the first example embodiment.

The wire portion 200 includes a switching transistor 10 and a thin film transistor 20 as shown in FIG. 2, and drives the organic light emitting element 300 by transmitting a signal thereto. The organic light emitting element 300 emits light according to the signal transmitted from the wire portion 200.

The organic light emitting element 300 is disposed on the wire portion 200.

The organic light emitting element 300 is provided in a display area on the first substrate 100 and receives a signal from the wire portion 200, and displays an image according to the received signal.

Hereinafter, an internal structure of the OLED display 1000 according to the first example embodiment will be described with reference to FIG. 2 to FIG. 4.

FIG. 2 illustrates the layout of a pixel structure of the OLED display according to the first example embodiment. FIG. 3 is a cross-sectional view of the pixel structure illustrated in FIG. 2, taken along the line III-III.

Figure 3:
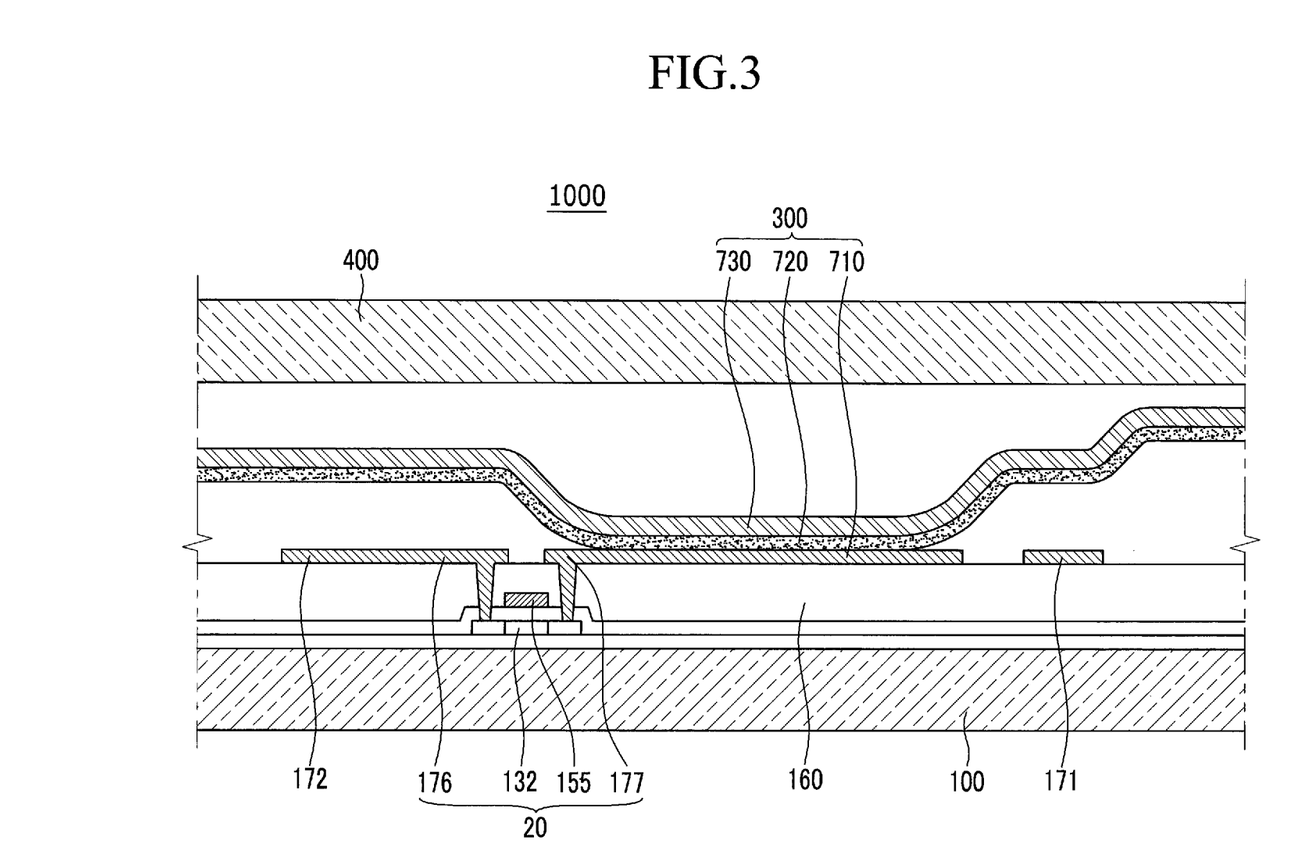
FIG. 3 is a cross-sectional view of the pixel structure illustrated in FIG. 2, taken along the line III-III.

Hereinafter, the entire structure of the wire portion 200 and the organic light emitting element 300 are shown in FIG. 2 and FIG. 3, but the example embodiment is not limited to the structure shown in FIG. 2 and FIG. 3. The structure of the wire portion 200 and the organic light emitting element 300 may be variously modified within a range that can be easily realized by a person skilled in the art. For example, in the accompanying drawings, an OLED display including an active matrix (AM) type organic light emitting element that has a 2Tr-1Cap structure in which each pixel of a display unit is provided with two thin film transistors (TFTs) and one capacitor is illustrated as a display device, but the present invention is not limited thereto. Thus, the number of thin film transistors, the number of capacitors, and the number of wires of the OLED display is not restrictive. In one embodiment, the pixel represents the minimum unit for displaying an image, and the OLED displays an image using a plurality of pixels.

As shown in FIG. 2 and FIG. 3, the OLED display 1000 includes a switching thin film transistor 10, a driving thin film transistor 20, a capacitor 80, and an organic light emitting element 300 formed in each pixel. Here, the switching thin film transistor 10, the driving thin film transistor 20, and the capacitor 80 form the wire portion 200. In addition, the wire portion 200 includes gate lines 151 arranged along one direction of the first substrate 100, and further includes data lines 171, and common power lines 172. The data lines 171 and the common power lines 172 cross the gate lines 151 in an insulated manner. Here, one pixel may be defined by the boundary formed of the gate line 151, the data line 171, and the common power line 172, but is not necessarily limited thereto.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switch for selecting a pixel for light emission. The switching gate electrode 152 is connected to the gate line 151. The switching source electrode 173 is connected to the data line 171. The switching drain electrode 174 is separated from the switching source electrode 173 and connected with one capacitor plate 158.

The driving thin film transistor 20 applies driving power to the first electrode 710 in a selected pixel for light emission of the organic emission layer 720 of an organic light emitting element 300. The driving gate electrode 155 is connected with the capacitor plate 158 that is connected with the switching drain electrode 174. The driving source electrode 176 and the other capacitor plate 178 are respectively connected with the common power line 172. The first electrode 710 of the organic light emitting element 300 is extended from the driving drain electrode 177, and the driving drain electrode 177 and the first electrode 710 are connected with each other.

The capacitor 80 includes a pair of capacitor plates 158 and 178, with an interlayer insulating layer 160 interposed therebetween. Here, the interlayer insulating layer 160 is a dielectric material, and capacitance of the capacitor 80 is determined by charges charged in the capacitor 80 and the voltage applied between the two capacitor plates 158 and 178.

With such a structure, the switching thin film transistor 10 is driven by a gate voltage applied to the gate line 151 to transmit a data voltage applied to the data line 171 to the driving thin film transistor 20. A voltage corresponds to a difference between a common voltage applied to the driving thin film transistor 20 from the common power line 172 and a data voltage transmitted from the switching thin film transistor 10 is stored in the capacitor 80, and a current corresponding to the voltage stored in the capacitor 80 flows to the organic light emitting element 30 through the driving thin film transistor 20 such that the organic light emitting element 300 emits light.

The organic light emitting element 300 includes the first electrode 710, an organic emission layer 720 disposed on the first electrode 710, and a second electrode 730 disposed on the organic emission layer 720.

Figure 4:
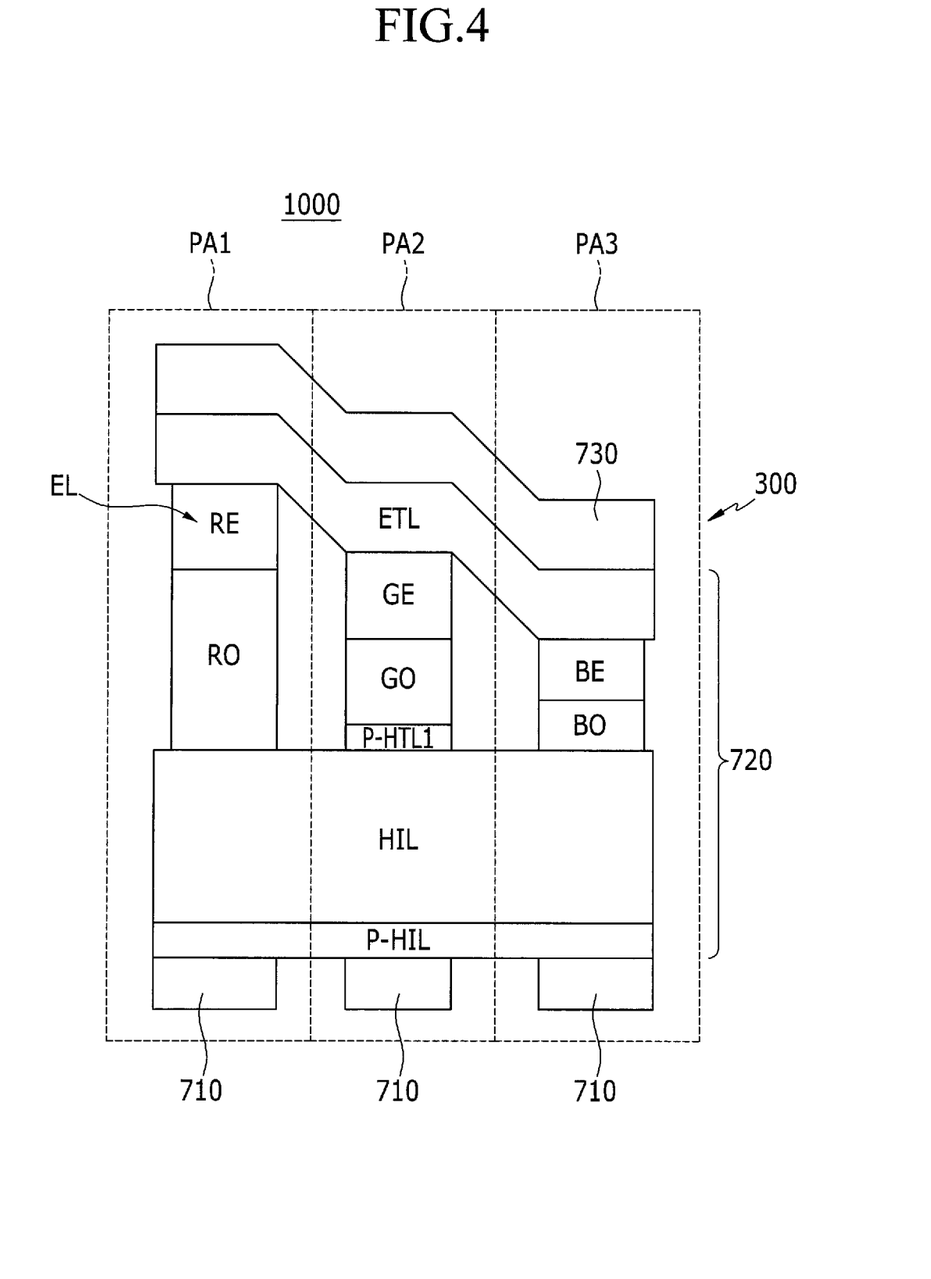
FIG. 4 is a cross-sectional view of main constituent elements in the OLED display according to the first example embodiment.

FIG. 4 is a cross-sectional view of main constituent elements in the OLED display according to the first example embodiment. In FIG. 4, main constituent elements corresponding to a first pixel, a second pixel, and a third pixel that neighbor each other are illustrated for better understanding and ease of description.

As shown in FIG. 4, the first electrode 710 is provided in plural, and each of the plurality of first electrodes are separated from each other respectively, corresponding to the first pixel PA1, the second pixel PA2, and the third pixel PA3 that neighbor each other.

The second electrode 730 is disposed on the first electrode 710, with an interposing organic emission layer 720 therebetween, and the location of the second electrode 730 corresponds to the first pixel PA1, the second pixel PA2, and the third pixel PA3. The second electrode 730 is provided to extend over the organic emission layer 720 corresponding to the first pixel PA1, the second pixel PA2, and the third pixel PA3.

The first electrode 710 becomes an anode which is a hole injection electrode, and the second electrode 730 becomes a cathode which is an electron injection electrode.

Holes and electrodes are injected into the organic emission layer 720 respectively from the first electrode 710 and the second electrode 730. When an exciton, in which a hole and an electron injected into the organic emission layer 720 are coupled to each other, falls from an excited state to a ground state, light emission occurs. Further, the first electrode 710 and the second electrode 730 may respectively include a single-layered or multi-layered light transmissive conductive material or light reflective conductive material that includes at least one of indium tin oxide (ITO), indium zinc oxide (IZO), aluminum (Al), silver (Ag), or the like.

The organic emission layer 720 is located corresponding to the first pixel PA1, the second pixel PA2, and the third pixel PA3, and includes a hole injection layer HIL, a main emission layer (EL), a first p-type hole transport layer (p-HTL1), a first auxiliary layer (RO), a second auxiliary layer (GO), a third auxiliary layer (BO), and electron transport layer ETL.

The hole injection layer HIL is disposed on the plurality of first electrodes 710, and extended over the plurality of first electrodes 710 corresponding to the first pixel PA1, the second pixel PA2, and the third pixel PA3. The hole injection layer HIL helps holes injected from the anode, that is, the first electrode 710 to be smoothly injected to the main emission layer EL.

The hole injection layer HIL includes a p-type hole injection layer p-HIL.

The p-type hole injection layer p-HIL contacts the first electrode 710 and is p-type doped. Since the p-type hole injection layer p-HIL is p-type doped, holes can be easily injected to the main emission layer EL from the first electrode 710.

The main emission layer (EL) is disposed on the hole injection layer HIL, and includes a first emission layer RE emitting red light, a second emission layer GE emitting green light, and a third emission layer BE emitting blue light. The first emission layer RE, the second emission layer GE, and the third emission layer BE are layers emitting light from combination of the holes and the electrons injected respectively from the first electrode 710 and the second electrode 730.

The first emission layer RE corresponding to the first pixel PA1 is separated from the second emission layer GE, and disposed on the hole injection layer HIL. The first emission layer RE includes a red fluorescent material, and includes an organic material having electric resistance that is smaller than that of the second emission layer GE. The first emission layer RE emits red light by receiving holes and electrons from the first electrode 710 and the second electrode 730 as a current flows between the first electrode 710 and the second electrode 730.

The second emission layer GE corresponding to the second pixel PA2 is separated from the first emission layer RE, and is disposed on the hole injection layer HIL. The second emission layer GE includes a green phosphorescent material, and includes an organic material having electric resistance that is greater than that of the first emission layer RE and that of the third emission layer BE. The second emission layer GE emits green light by receiving holes and electrons respectively from the first electrode 710 and the second electrode 730 as a current flows between the first electrode 710 and the second electrode 730.

The third emission layer BE corresponding to the third pixel PA3 is separated from the second emission layer GE, and is disposed on the hole injection layer HIL. The third emission layer BE includes a blue fluorescent material, and includes an organic material having electric resistance that is smaller than that of the second emission layer GE. The third emission layer BE emits blue light by receiving holes and electrons respectively from the first electrode 710 and the second electrode 730 as a current flows between the first electrode 710 and the second electrode 730.

The first p-type hole transport layer p-HTL1 is disposed between the second emission layer GE and the hole injection layer HIL corresponding to the second pixel PA2, and easily transfers holes injected to the second emission layer GE from the first electrode 710 through the hole injection layer HIL. The first p-type hole transport layer p-HTL1 is p-type doped. Since the first p-type hole transport layer p-HTL1 is p-type doped, the current smoothly flows from the first electrode 710 through the hole injection layer HIL to the second emission layer GE through the first p-type hole transport layer p-HTL1 so that holes can be smoothly transported to the second emission layer GE.

The first p-type hole transport layer p-HTL1 is disposed only between the second emission layer GE and the hole injection layer HIL corresponding to the second pixel PA2.

Since the p-type doped first p-type hole transport layer p-HTL1 is disposed only between the second emission layer GE and the hole injection layer HIL corresponding to the second pixel PA2, when the organic light emitting element 300 is not driven by the wire portion 200 and thus displays a black image, an undesired micro current flows only to the first p-type hole transport layer p-HTL1 through the wire portion 200, but not to the first emission layer RE and the third emission layer BE disposed corresponding to the first pixel PA1 and the third pixel PA3 respectively so that the first pixel PA1 and the third pixel PA3 can be prevented from emitting light due to the micro current.

The first auxiliary layer RO is disposed between the first emission layer RE and the hole injection layer HIL and has a first thickness. The second auxiliary layer GO is disposed between the second emission layer GE and the hole injection layer HIL and has a second thickness that is thinner than the first thickness. The third auxiliary layer BO is disposed between the third emission layer BE and the hole injection layer and has a third thickness that is thinner than the second thickness.

Since the thickness of the first auxiliary layer RO, the thickness of the second auxiliary layer GO, and the thickness of the third auxiliary layer BO are sequentially reduced, spaces between the first electrodes 710 and the second electrodes 730 corresponding to the first pixel PA1, the second pixel PA2, and the third pixel PA3 respectively are sequentially decreased so that reinforcement interference is generated in the red light emitted from the first emission layer RE, the green light emitted from the second emission layer GE, and the blue light emitted from the third emission layer EL depending on the wavelength of each light, thereby improving light emission efficiency and color reproduction range of light emitted from the main emission layer EL. That is, light emission efficiency and color reproduction range of an image displayed from the organic light emitting element 300 can be improved.

The electron transport layer ETL is disposed between the main emission layer EL and the second electrode 730. The electron transport layer ETL helps the electrons injected from the second electrode 730, which is a cathode, to be smoothly injected to the first emission layer RE, the second emission layer GE, and the third emission layer BE, respectively.

Meanwhile, an electron injection layer may be disposed between the electron transport layer ETL and the second electrode 730.

As described above, in the OLED display 1000 according to the first example embodiment, the p-doped first p-type hole transport layer p-HTL1 is disposed only between the second emission layer GE and the hole injection layer HIL corresponding to the second pixel PA2, and thus when the organic light emitting element 300 is not driven by the wire portion 200 and thus displays a black image, an undesired micro current flows only to the first p-type hole transport layer p-HTL1 through the wire portion 200, but not to the first emission layer RE and the third emission layer BE corresponding to the first pixel PA1 and the third pixel PA3 so that the first pixel PA1 and the third pixel PA3 can be suppressed from emitting light due to the micro current.

In addition, in the OLED display 1000 according to the first example embodiment, although the micro current flows to the first p-type hole transport layer p-HTL1, the second emission layer GE has greater electric resistance compared to the first emission layer RE and the third emission layer BE so that light emission of the second emission layer GE due to the micro current flowing to the first p-type hole transport layer p-HTL1 can be reduced or minimized.

That is, the main emission layer EL of the OLED display 1000 can be prevented from emitting light due to the undesired micro current through the wire portion 200.

Hereinafter, an OLED display according to a second example embodiment will be described with reference to FIG. 5.

Hereinafter, only characteristic components distinguished from the first example embodiment will be described in more detail, and the components omitted from the description follow the first example embodiment.

In addition, in the second example embodiment, for convenience of description, like constituent elements will be described by using like reference numerals of the first example embodiment.

Figure 5:
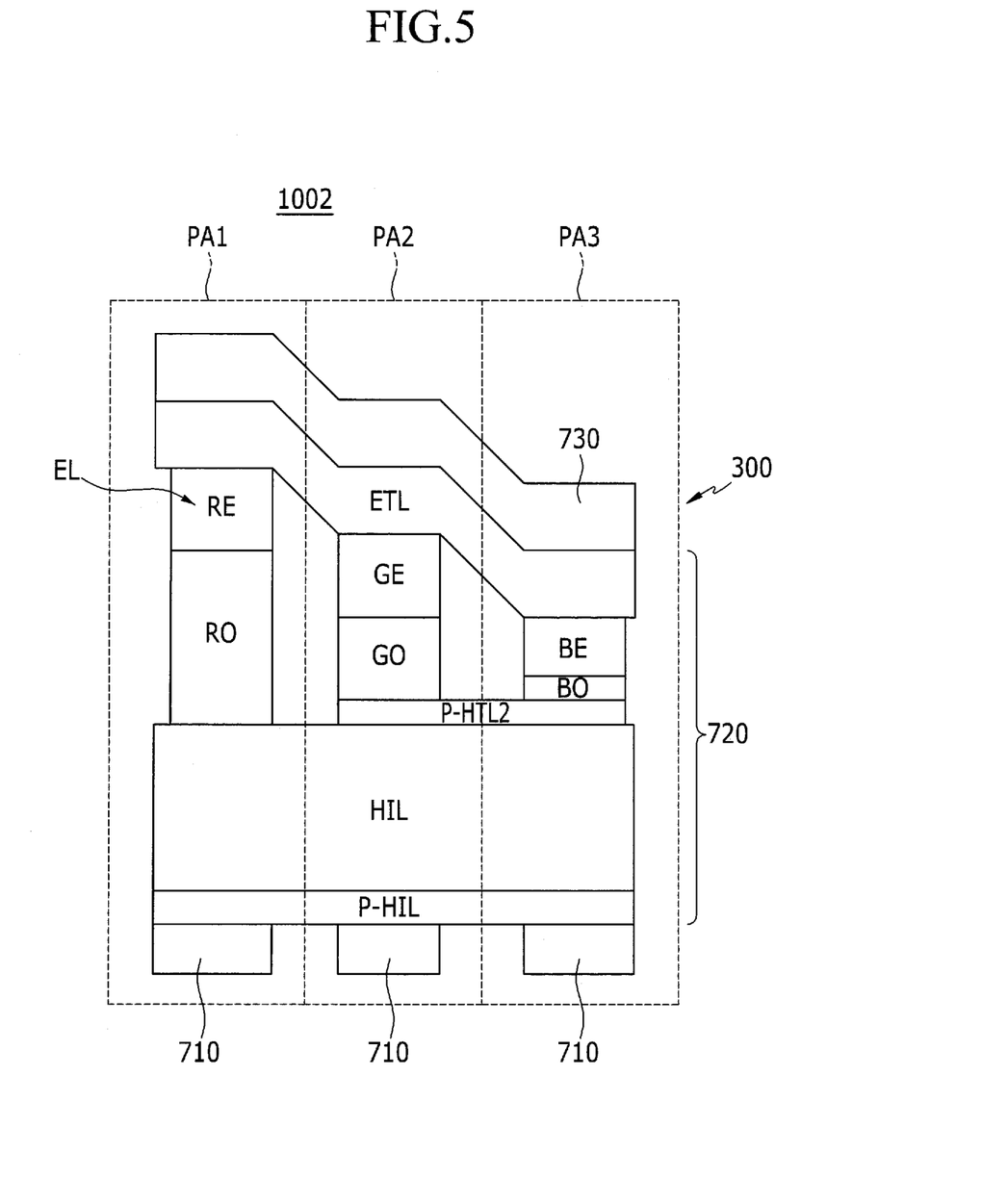
FIG. 5 is a cross-sectional view of main constituent elements in an OLED display according to a second example embodiment.

FIG. 5 is a cross-sectional view illustrating main constituent elements in the OLED display according to the second example embodiment.

As shown in FIG. 5, an organic emission layer 720 of an OLED display 1002 according to the second example embodiment is located corresponding to a first pixel PA1, a second pixel PA2, and a third pixel PA3, and includes a hole injection layer HIL, a main emission layer EL, a second p-type hole transport layer p-HTL2, a first auxiliary layer RO, a second auxiliary layer GO, a third auxiliary layer BO, and an electron transport layer ETL.

The second p-type hole transport layer p-HTL2 is provided to extend from between the second emission layer GE and the hole injection layer HIL corresponding to the second pixel PA2 to between the third emission layer BE and the hole injection layer HIL corresponding to the third pixel PA3. Since the second p-type hole transport layer p-HTL2 is p-type doped, a current can easily flow to the second emission layer GE and the third emission layer BE through the second p-type hole transport layer p-HTL2 from the first electrode 710 so that holes can be smoothly transported to the second emission layer GE and the third emission layer BE.

The second p-type hole transport layer p-HTL2 is provided to extended only from between the second emission layer GE and the hole injection layer HIL corresponding to the second pixel PA2 to between the third emission layer BE and the hole injection layer HIL corresponding to the third pixel PA3, and is not provided in the first pixel PA1.

As described, in the OLED display 1002 according to the second example embodiment, the p-type doped second p-type hole transport layer p-HTL2 is only extended from between the second emission layer GE and the hole injection layer HIL corresponding to the second pixel PA2 to between the third emission layer BE and the hole injection layer HIL corresponding to the third pixel PA3, and thus, when the organic light emitting element 300 is not driven by the wire portion 200 and thus displays a black image, an undesired micro current flows not to the first emission layer RE corresponding to the first pixel PA1 from the first electrode 710 but to the second p-type hole transport layer p-HTL2 through the wire portion 200 so that the first emission layer RE can be suppressed from emitting light due to the micro current.

In addition, in the OLED display 1002 according to the second example embodiment, although the micro current flows to the second p-type hole transport layer p-HTL2, the third emission layer BE has smaller electric resistance than the second emission layer GE so that the micro current moves to the portion of the second p-type hole transport layer p-HTL2 corresponding to the third pixel PA3 from the portion of the second p-type hole transport layer p-HTL2 corresponding to the second pixel PA2. As the micro current flows to the portion of the second p-type hole transport layer p-HTL2 located between the third emission layer BE and the hole injection layer HIL, the second emission layer GE that corresponds to the second pixel PA2 can be suppressed from emitting light due to the micro current.

Further, in the OLED display 1002 according to the second example embodiment, although the micro current flows to the portion of the second p-type hole transport layer p-HTL2 disposed between the third emission layer BE and the hole injection layer HIL that corresponds to the third pixel PA3, the third emission layer BE includes a blue fluorescent material having lower light emission efficiency than the green phosphorescent material so that light emission of the third emission layer BE due to the micro current flown to the portion of the second p-type hole transport layer p-HTL2 disposed between the third emission layer BE and the hole injection layer HIL that corresponds to the third pixel PA3 can be reduced or minimized.

That is, the main emission layer EL of the OLED display 1002 can be prevented from emitting light due to the undesired micro current through the wire portion 200.

Hereinafter, an OLED display according to a third example embodiment will be described with reference to FIG. 6.

Hereinafter, only characteristic components distinguished from the first example embodiment will be extracted and described, and the components omitted from the description follow the first example embodiment. In addition, in the third example embodiment, for convenience of description, like constituent elements will be described by using like reference numerals of the first example embodiment.

Figure 6:
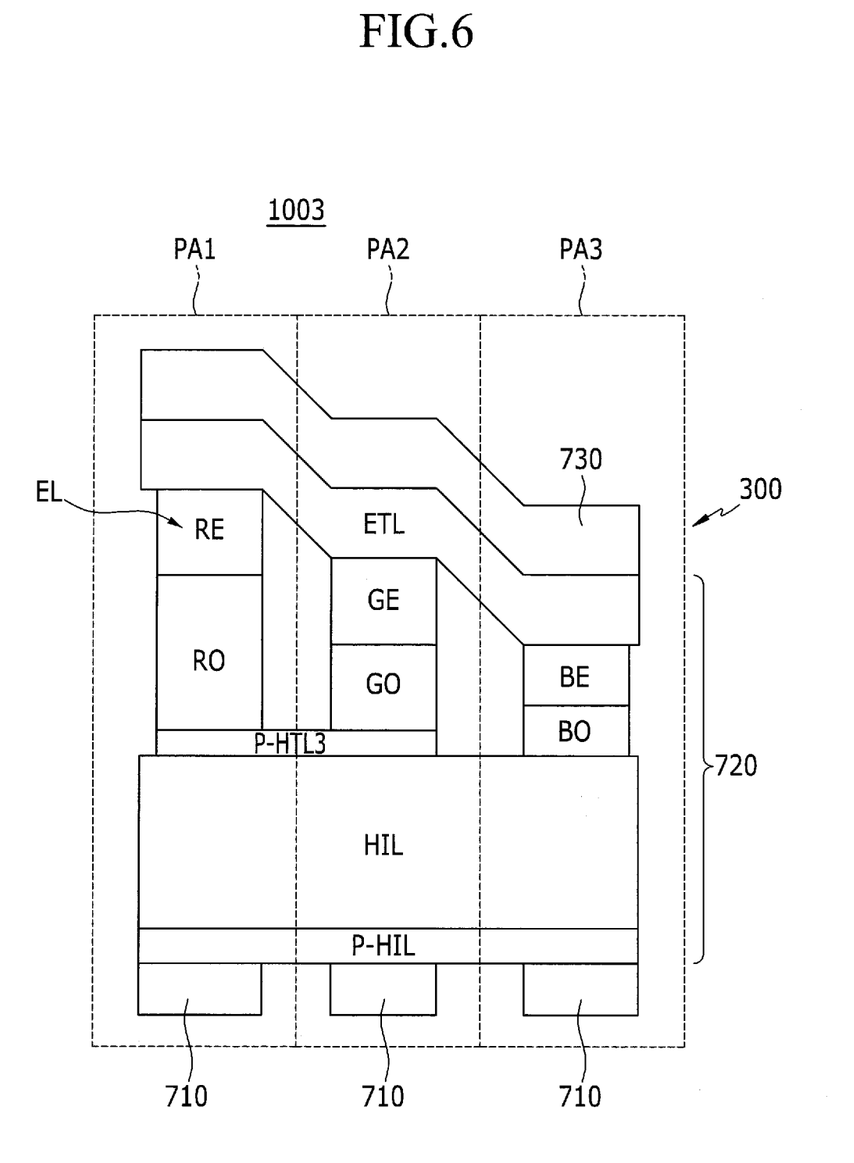
FIG. 6 is a cross-sectional view of main constituent elements in an OLED display according to a third example embodiment.

FIG. 6 is a cross-sectional view illustrating main constituent elements in the OLED display according to the third example embodiment.

As shown in FIG. 6, an organic emission layer 720 of an OLED display 1003 according to the third example embodiment is disposed corresponding to a first pixel PA1, a second pixel PA2, a third pixel PA3, and includes a hole injection layer, a main emission layer EL, a third p-type hole transport layer p-HTL3, a first auxiliary layer RO, a second auxiliary layer GO, a third auxiliary layer BO, and an electron transport layer ETL.

The third p-type hole transport layer p-HTL3 is provided to extend from between the second emission layer GE and the hole injection layer HIL corresponding to the second pixel PA2 to between the first emission layer RE and the hole injection layer HIL corresponding to the first pixel PA1. Since the third p-type hole transport layer p-HTL3 is p-type doped, a current can easily flow to the second emission layer GE and the first emission layer RE through the third p-type hole transport layer p-HTL3 from the first electrode 710 so that holes can be smoothly transported to the second emission layer GE and the first emission layer RE.

The third p-type hole transport layer p-HTL3 is provided to extend only from between the second emission layer GE and the hole injection layer HIL corresponding to the second pixel PA2 to between the first emission layer RE and the hole injection layer HIL corresponding to the first pixel PA1, and is not provided in the third pixel PA3.

As described, in the OLED display 1003 according to the third example embodiment, the p-type doped third p-type hole transport layer p-HTL3 is provided to extend only from between the second emission layer GE and the hole injection layer HIL corresponding to the second pixel PA2 to between the first emission layer RE and the hole injection layer HIL corresponding to the first pixel PA1, and thus when the organic light emitting element 300 is not driven by the wire portion 200 and thus displays a black image, an undesired current flows from the first electrode 710 to the third p-type hole transport layer p-HTL3 through the wire portion 200, but not to the third emission layer BE disposed corresponding to the third pixel PA3 so that the third emission layer BE can be suppressed from emitting light due to the micro current.

In addition, in the OLED display 1003 according to the third example embodiment, although the micro current flows to the third p-type hole transport layer p-HTL3, the first emission layer RE has smaller electric resistance compared to the second emission layer GE so that the micro current flows to the portion of the third p-type hole transport layer p-HTL3 corresponding to the first pixel PA1 from the portion of the third p-type hole transport layer p-HTL3 corresponding to the second pixel PA2. As the micro current flows to the portion of the third p-type hole transport layer p-HTL3 disposed between the first emission layer RE and the hole injection layer HIL, the second emission layer GE corresponding to the second pixel PA2 can be suppressed from emitting light due to the micro current.

Further, in the OLED display 1003 according to the third example embodiment, although the micro current flows to the portion of the third p-type hole transport layer p-HTL3 disposed between the first emission layer RE corresponding to the first pixel PA1 and the hole injection layer HIL, the first emission layer RE includes a red fluorescent material having lower light efficiency compared to the green phosphorescent material so that light emission of the first emission layer RE due to the micro current flown to the portion of the third p-type hole transport layer p-HTL3 disposed between the first emission layer RE and the hole injection layer HIL corresponding to the first pixel PA1 can be reduced or minimized.

That is, the main emission layer EL of the OLED display 1003 can be prevented from emitting light due to the undesired micro current through the wire portion 200.

According to the example embodiments, the main emission layer of the OLED display can be suppressed from emitting light due to an undesired micro current.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims, and equivalents thereof.

DESCRIPTION OF SYMBOLS first pixel PA1, second pixel PA2, third pixel PA3, first electrode 710, hole injection layer HIL, main emission layer EL, p-type hole transport layer p-HTL1, p-HTL2, p-HTL3, second electrode 730

What is claimed is:
1. An organic light emitting diode (OLED) display comprising:
   a first pixel;
   a second pixel neighboring the first pixel;
   a third pixel neighboring the second pixel;
   a plurality of first electrodes corresponding to the first pixel, the second pixel, and the third pixel respectively and being separated from each other;
   a hole injection layer on the plurality of first electrodes;
   a main emission layer comprising a first emission layer on the hole injection layer corresponding to the first pixel, a second emission layer on the hole injection layer corresponding to the second pixel, and a third emission layer on the hole injection layer corresponding to the third pixel;
   a p-type hole transport layer between the second emission layer and the hole injection layer and being p-type doped; and
   a second electrode on the main emission layer, wherein
   the second emission layer comprises an organic material having greater electric resistance than each of an organic material of the first emission layer and an organic material of the third emission layer, and
   the p-type hole transport layer is provided only between the second emission layer and the hole injection layer, or is provided to extend only from between the second emission layer and the hole injection layer to between the hole injection layer and one of the first emission layer or the third emission layer.

2. The OLED display of claim 1, wherein the hole injection layer is provided to extend over each of the plurality of first electrodes corresponding to the first pixel, the second pixel, and the third pixel.

3. The OLED display of claim 2, wherein the first emission layer comprises a red fluorescent material, the second emission layer comprises a green phosphorescent material, and the third emission layer comprises a blue fluorescent material.

4. The OLED display of claim 1, wherein the p-type hole transport layer HTL is provided only between the second emission layer and the hole injection layer.

5. The OLED display of claim 1, wherein the p-type hole transport layer is provided to extend only from between the second emission layer and the hole injection layer to between the third emission layer and the hole injection layer.

6. The OLED display of claim 1, wherein the p-type hole transport layer is provided to extend only from between the second emission layer and the hole injection layer to between the first emission layer and the hole injection layer.

7. The OLED display of claim 1, wherein the hole injection layer HIL comprises a p-type hole injection layer contacting the first electrode and p-type doped.

8. The OLED display of claim 1, further comprising an electron transport layer provided between the main emission layer and the second electrode.

9. The OLED display of claim 1, further comprising:
a first auxiliary layer between the first emission layer and the hole injection layer and having a first thickness;
a second auxiliary layer between the second emission layer and the hole injection layer and having a second thickness that is thinner than the first thickness; and
a third auxiliary layer between the third emission layer and the hole injection layer and having a third thickness that is thinner than the second thickness.

* * * * *